(12) United States Patent
Westphal

(10) Patent No.: US 7,196,600 B2
(45) Date of Patent: Mar. 27, 2007

(54) LOW RESISTANCE SHIELD

(75) Inventor: Michael Westphal, Offenbach (DE)

(73) Assignee: Bruker Biospin GmbH, Rheinstetten (DE)

(*) Notice: Subject to any disclaimer, the term of this patent is extended or adjusted under 35 U.S.C. 154(b) by 33 days.

(21) Appl. No.: 10/986,929

(22) Filed: Nov. 15, 2004

(65) Prior Publication Data

US 2005/0110602 A1    May 26, 2005

(30) Foreign Application Priority Data

Nov. 22, 2003 (DE) ................. 103 54 676

(51) Int. Cl.
*H01F 6/00* (2006.01)

(52) U.S. Cl. ............... 335/216; 174/35 MS; 324/318; 505/872

(58) Field of Classification Search ......... 174/35 MS, 174/125.1; 324/318–320; 335/216; 505/872
See application file for complete search history.

(56) References Cited

U.S. PATENT DOCUMENTS

| | | |
|---|---|---|
| 4,828,931 A | 5/1989 | Ogawa |
| 4,920,011 A | 4/1990 | Ogawa |
| 5,656,380 A * | 8/1997 | Raber et al. ............. 428/608 |
| 5,701,744 A | 12/1997 | Eckels |

* cited by examiner

*Primary Examiner*—Ramon M. Barrera
(74) *Attorney, Agent, or Firm*—Paul Vincent

(57) ABSTRACT

A flat multi-layer arrangement (1; 1a–1f) of superconducting wires (4,5) with normally conducting substrate (17) and at least one fiber (16) which is electrically conductingly connected to the substrate (17) and is superconducting under predetermined operating conditions is characterized in that the superconducting wires (4, 5) in a respective layer (2, 3; 22, 23) are substantially disposed such that they do not cross. A resistive electric contact is provided between the superconducting wires (4, 5) of different layers (2,3; 22, 23) and the superconducting wires (4, 5) of at least two neighboring layers (2, 3; 22, 23) do cross, wherein no closed superconducting loops are present in the arrangement (1; 1a–1f). This arrangement permits shielding of the working volume of a magnet coil arrangement against low-frequency stray fields in an efficient and reliable manner.

26 Claims, 9 Drawing Sheets

LOW RESISTANCE SHIELD

This application claims Paris Convention priority of DE 103 54 676.6 filed Nov. 22, 2003 the complete disclosure of which is hereby incorporated by reference.

BACKGROUND OF THE INVENTION

The invention concerns a flat, multi-layer arrangement of superconducting wires with a normally conducting substrate and at least one fiber which is electrically conductively connected to the substrate and is superconducting at predetermined operating conditions.

A flat electrically conductive arrangement of this type is disclosed e.g. in U.S. Pat. No. 5,701,744.

Strong magnetic fields are used for nuclear magnetic resonance (NMR) spectroscopy or in magnetic resonance imaging (MRI) methods. These magnetic fields are generated using superconducting magnet coil systems. Optimum measuring conditions can be obtained, in particular, when the working volume inside the magnet coil system is not influenced by temporary external magnetic field fluctuations (stray fields).

Such stray fields may be caused, in particular, by cooling systems which cool the superconducting magnet coils. Widely used cooling systems are operated with periodically running adiabatic expansion of a working gas, such as helium, wherein a stray field of the same period is generated.

The stray field is generated e.g. by a movable ferromagnetic piston or by a magnetic phase change in a regenerator material. The cooling systems have relatively long cycle times in the range of one second (corresponding to a low working frequency of approximately 1 Hz).

To reduce the influence of stray fields on the working volume, an additional periodic field is conventionally generated using magnet coils to actively compensate for corresponding periodic stray fields in the working volume. It is, however, very difficult to generate an additional field which exactly compensates for a disturbance.

Inductive shielding of the working volume using a copper cylinder is also a conventional solution. The copper shielding operates efficiently at high disturbing frequencies but is insufficient at low disturbing frequencies, in particular, around 1 Hz.

In another conventional means, stray fields are neutralized using: a superconducting shielding collar which is locally disposed around the source of disturbance (see U.S. Pat. No. 5,701,744). Towards this end, a flat superconductor is inserted into the collar. These flat superconductors tend to be instable, since the current paths are not unambiguously defined. For small temperature fluctuations, the superconduction may temporarily fail thereby generating strong magnetic field disturbances in the working volume.

U.S. Pat. No. 5,701,744, which will be described in more detail below, discloses a main field magnet of a magnetic resonance apparatus comprising a superconducting main field coil for generating a temporally and locally constant magnetic field in a working volume. The main field coil is located in a liquid helium cryostat bath. The consumption of expensive liquid helium is prevented through use of a refrigerator having a cold head which is mounted to the cryostat. The cold head described in U.S. Pat. No. 5,701,744 has excellent cooling properties, since a so-called regenerator material of Er and Ni or Ho and Cu is used in its cold region, which is magnetically phase-changed at the low operating temperatures in the region of 3 to 20 K. The material, which is generally ferrimagnetic at low temperatures, is magnetized in the background field of the main field magnet. This causes an associated problem, since the magnetized regenerator material of the type of cold heads described in U.S. Pat. No. 5,701,744 periodically reciprocates according to the Gifford McMahon principle, thereby representing a temporally varying magnetic source of disturbance for the magnetic field in the working volume. In modern pulse tube coolers as are produced e.g. by the company Cryomech Inc. Syracuse, N.Y., USA, this problem is already considerably reduced since the regenerator material is no longer moved. The regenerator material thereby still represents a temporally periodic magnetic source of disturbance of reduced strength, since the temperature of the regenerator material and thereby of the magnetized volume portion periodically changes during operation. This is still a problem for magnetic resonance apparatus with particular quality requirements. The frequency of the disturbances caused by periodically operating refrigerators is between 0.1 Hz and 10 Hz.

U.S. Pat. No. 5,701,744 attempts to solve these problems by surrounding the so-called cold finger of the cold head containing the regenerator material, with a collar of a superconducting bismuth alloy, preferably lead-bismuth. In such a collar of ideal superconducting material, shielding currents are generated which largely compensate for the effect of the magnetic stray fields generated by the enclosed regenerator material outside of the collar where the investigational volume of the magnetic resonance apparatus is located. In view of the dimensions of the cold fingers of conventional coolers, such a collar has a diameter of at least approximately 0.05 m and a length of at least 0.1 m.

Through the excitation of corresponding shielding currents, such a collar of superconducting material shields both magnetic stray fields generated by the enclosed regenerator material towards the outside as well as the inner space surrounded by the collar from the static magnetic field of the main field magnet. This causes problems, since the superconducting material of the collar is necessarily flat and has transverse dimensions on the order of magnitude of 0.1 m. Moreover, the superconductors already tend to be unstable at transverse dimensions of less than 1 mm, which can lead to a sudden transition into the normally conducting state and an associated sudden drop in the shielding currents. This produces particularly strong disturbances of the magnetic field in the working volume of the NMR apparatus of a kind which should actually be prevented.

In contrast thereto, it is the object of the present invention to present a shielding for the working volume of a magnet coil arrangement which can efficiently and reliably shield low-frequency stray fields.

SUMMARY OF THE INVENTION

This object is achieved in accordance with the invention with an arrangement of the above-mentioned type in that the superconducting wires are disposed in the respective layer such that they substantially do not cross, and a resistive electric contact is produced between the superconducting wires of different layers, wherein the superconductor wires of at least two neighboring layers cross, and the arrangement contains no closed superconducting loops.

A shielding body or cylinder which surrounds the working volume may be produced from the inventive flat arrangement. In an alternative manner, a shielding body or cylinder produced from an inventive flat arrangement locally surrounds the source of disturbance e.g. the cooling head of a refrigerator.

Since e.g. the magnetic disturbances caused by the refrigerators occur in time cycles, and therefore have frequency components above and including certain values (around 0.1 to 10 Hz), resistive shielding bodies may be used in accordance with the invention in which shielding eddy currents also flow instead of permanent shielding currents with infinite time constants as are theoretically expected for superconducting bodies. The resistive shielding bodies have sufficiently good shielding behavior only above a sufficiently low threshold frequency. The electrical conductance of pure metals such as e.g. copper at low temperatures of approximately 5 K is generally not sufficient in this case.

The effective electrical conductance of the flat arrangement is much better than that of copper, since the current is largely guided without resistance via superconducting fibers and only over short distances through resistive material such as e.g. copper. Since the electrical resistance of the inventive arrangement does not vanish, a magnetic field may be formed inside the shielding. A working volume which is surrounded by an inventive shielding arrangement can thereby easily be loaded with a strong magnetic field using a main field coil, e.g. during charging of the main field coil.

The inventive arrangement is formed by a plurality of individual superconducting wires, and since there are nearly no crossings, the superconducting wires define, at least in sections, a preferred current flow direction. The current paths are sufficiently defined to prevent superconduction instabilities which may occur e.g. in conventional flat superconductors.

For transporting electric current within the flat arrangement in the direction of the superconducting wires in one or another layer, the superconducting wires exclusively provide the current transport in the current direction and the electrical resistance completely vanishes. For the general case of transporting electric current within the flat arrangement other than in the direction of the superconducting wires in one or another layer, a current distribution is obtained with which the slanting superconducting wires transport current without resistance in proportion to the cosine of their direction with respect to the current direction. Moreover, a resistive current compensation between the layers is produced transverse to the surface of the arrangement in agreement with the continuity equation. This current compensation is basically effected via the extremely small value t of the transverse distance between the superconducting fibers of the superconducting wires in the neighboring layers and is distributed over large transition surfaces A on the order of magnitude of the surface of the arrangement itself, to produce in accordance with the formula $$R=\rho t/A$$

($\rho$: specific electrical resistance of the substrate) extremely small resistances R for the current transport despite the fundamentally resistive current compensation. The at least one superconducting fiber may also be band-shaped and, in this case, be conductingly electrically connected to the substrate on one side only. The substrate of commercial superconducting wires is often copper of high purity which is therefore highly electrically conducting at low temperatures. Another substrate material with deliberately smaller electric conductivity is e.g. a copper-nickel alloy.

The eddy currents generated during shielding have components which always flow in a direction which is not parallel to the fiber direction. For this reason, the effective electrical conductance of the inventive arrangement for eddy currents is always different from zero.

The superconducting wires preferably comprise a resistively conducting coating (e.g. a copper coating) and at least one superconducting fiber which is completely surrounded by the coating. A bundle of superconducting fibers is generally completely surrounded by the coating and the fibers of a bundle are at least partially in direct contact. The superconducting wire may, in particular, be a multi-filament wire. The outer contours of the superconducting wires may be band-shaped or round.

In a preferred embodiment of the inventive arrangement, the superconducting wires of a first layer form the warp threads and the superconducting wires of a second layer form the weft threads of a fabric, wherein the two layers spatially penetrate each other. One advantage of such a fabric is that it represents a flexible mechanically stable arrangement even without using solder. To improve the electric contact between the layers and minimize the thickness of the arrangement, the fabric is preferably pressed or rolled flat thereby producing a very low electric contact resistance between the layers which is still considerably smaller compared to using a solder which, being an alloy, always causes a relatively large contact resistance at low temperatures.

In an alternative preferred embodiment, the layers form substantially mutually parallel surfaces, in particular, mutually parallel curved surfaces. This provides a particularly simple first production method, wherein the layers are individually produced and subsequently connected to each other. A layer may be produced e.g. from superconducting wire which is coated with a solder, wherein the superconducting wire is initially tightly wound onto a cylindrical winding body, the windings bordering each other, and the solder is then heated and melted such that the bordering and soldered windings form a first flat body. This flat body may be cut parallel to the axis of the winding body and be used as a first layer in an inventive arrangement. Alternatively, a spirally wound superconducting wire may also be used. In this case, it is also helpful to coat the superconductor with a solder which can be shaped into a flat body through heating after winding.

In one particularly preferred embodiment of the inventive arrangement, the superconducting wires of at least two layers are disposed parallel to each other in the respective layer and the two layers are soldered together with a solder which is normally conducting under the predetermined operating conditions. This simple production method is possible for each individual layer by winding a superconducting wire coated with a solder about a cylindrical winding body, soldering and cutting, as described in the last paragraph. Two flat bodies of this type may be disposed on top of each other such that the superconducting wires in both bodies subtend a finite angle with respect to each other and the two bodies are then heated and soldered together. A mechanically stable, flexible, inventive flat arrangement is produced in this manner, wherein both layers are soldered together in a reliable electrically conducting manner.

In another preferred embodiment, the superconducting wires of at least one layer are soldered onto a flat support body, which is normally conducting at the operating conditions, using a solder which is normally conducting. The support body is e.g. a thin sheet metal of copper or a copper alloy. In this manner, an individual layer of the inventive arrangement may be produced which is flexible and nevertheless mechanically stable. Such support bodies can also be disposed between the layers to deliberately influence the electrical resistance of the inventive arrangement through selection of the support body material, its electric conductance, and/or its thickness.

In one particularly preferred embodiment, the superconducting wires of at least two layers cross at angles of at least 30°. In a further development of this embodiment, the superconducting wires of two layers cross at an angle of 90°, thereby blocking current directions with relatively high electrical resistance.

In one further advantageous development, the superconducting wires of the layers are directly soldered to a flat support body using a solder which is normally conducting under predetermined operating conditions thereby producing a flexible, mechanically stable arrangement with reliable electric contact between the layers.

To minimize the thickness of the flat arrangement and the required amount of expensive superconducting wire, embodiments are often preferred with which the superconducting wires have a flat cross-section with large width parallel to the surface and a small height perpendicular thereto.

In a plurality of applications, embodiments are preferred with which the at least one superconducting fiber in the superconducting wires of at least one layer is a low temperature superconductor, which is superconducting only at temperatures below a critical temperature of 30K. The relatively low productions costs and the simple handling of low temperature superconductors are advantageous. A superconducting alloy which is well suited in this case is niobium-titanium. These embodiments are advantageous if the inventive arrangement is part of a system having operating temperatures below 30K which are required for other reasons, e.g. for operation of magnetic resonance apparatus main field magnets.

In an alternative embodiment, the at least one superconducting fiber in the superconducting wires of at least one layer is a high-temperature superconductor which is superconducting at temperatures below a critical temperature which is above 30K. The technical and financial expense for cooling the arrangement may be considerably smaller compared to using low-temperature superconductors.

In one further preferred embodiment of the inventive arrangement, at least two layers each consist of partial sections flatly disposed next to each other, wherein the partial sections of a layer are not directly connected to each other or only resistively connected to each other, and the borders between the partial sections of the two layers are mutually displaced in one plane. The partial sections of different layers thereby overlap and the transverse current transport in the overlapping regions may have a low resistance. In accordance with this embodiment, larger flat arrangements of smaller overlapping partial sections may be formed. If desired, the electrical resistance of the inventive arrangements may be deliberately changed from small values to larger values through selection of the shapes and sizes of the partial sections. Neighboring partial sections may also overlap like fish scales or roof tiles, i.e. one partial layer is disposed on a first side flatly below a neighboring partial section and on an opposite side is disposed flatly above a neighboring partial section.

In a particularly preferred embodiment, the flat arrangement is formed as closed cylinder surface, in particular as a circular cylinder surface. The envelope of cylinder surfaces defines two semi-spaces, an inner space and an outer space. An electrically conducting flat arrangement in the form of a closed cylinder surface fundamentally shields the inner space from temporally varying high-frequency magnetic stray field sources in the external space and vice versa. The external space is thereby shielded from high-frequency magnetic disturbance sources located in the inner space. A theoretically ideal arrangement is thereby an infinitely long cylinder with infinite electric conductivity. The infinite length thereby causes complete spatial separation between the magnetic source of disturbance and the region to be shielded. Flat shielding currents are thereby induced on the surface of the cylinder irrespective of the geometrical shape of the source of disturbance, such that the magnetic field on the other side remains completely unchanged. If the electric conductance of the arrangement becomes finite, this still applies to a good approximation, however, only for field disturbances of sufficiently high frequency. In accordance with the teaching of the invention, the conductance may be selected such that relatively low-frequency field disturbances can also be shielded which cannot be shielded with completely normally conducting shieldings.

In a further development of this embodiment in accordance with the invention, the time constant of an induced current which flows in the peripheral direction of the cylinder is adjusted to a predetermined value through selection and arrangement of the superconducting wires and of the resistive materials used to preferably be between 1 second and 5 minutes. In this manner, disturbances of relatively low frequency can be shielded, e.g. in the region below 1 Hz. Nevertheless, a superconducting magnet of a magnetic resonance apparatus containing such an arrangement and having charging and discharging times of several hours, can still be charged or discharged. The time constant $\tau$ of an induced current flowing in the peripheral direction of the cylinder is obtained as a quotient between the inductance L and the electrical resistance R which are associated with the current:

$$\tau = L/R.$$

The time constant $\tau$ can thereby be deliberately adjusted through the electrical resistance R and that electrical resistance R can be adjusted within wide limits through selection and arrangement of the superconducting wires in overlapping partial layers and through selection of the used resistive materials of the substrate of the superconducting wires and of the flat support bodies and solders. Such arrangements permit, in particular, adjustment of particularly small resistances and therefore of particularly large time constants.

In another preferred embodiment of an inventive arrangement, the superconducting wires are transformed from the superconducting to the normally conducting state through selection of their superconducting properties with deliberately predetermined values of the current load at the operating conditions. In this manner, the arrangements have the desired extremely small electrical resistances only up to the adjusted predetermined current load and assume relatively large electrical resistance values for larger current loads. This can be utilized in an advantageous manner for various purposes. Relatively small values of the predetermined current load also lead e.g. to a good shielding behavior from temporally varying field disturbances with their typically very small shielding currents. On the other hand, in case of a quench of the main field magnet, cylindrical arrangements which are integrated in the winding of the superconducting main field magnet are transferred at an early stage into the then desired resistive, normally conducting state in which they no longer carry large currents and consequently no longer generate undesired large magnetic stray fields.

The present invention also includes a magnet system, in particular of an NMR, MRI or ICR (ion cyclotron resonance) apparatus which comprises at least one inventive arrangement as described above. These magnet systems require particularly great temporal stability for the magnetic field which they generate in the working volume. Shielding of temporally varying field disturbances using the inventive arrangements is therefore particularly useful.

One preferred embodiment of the inventive magnet system has a superconducting magnet coil which is disposed, in particular, in a helium tank of a cryostat, and is preferably actively shielded, wherein the arrangement is disposed on a cylindrical support body, in particular on a wall of the helium tank or on the outermost windings of the superconducting magnet coil or part thereof. The magnet coil is preferably cylindrically symmetric. Such cylindrically symmetric magnet coils generate large temporally stable magnetic fields in NMR, MRI or ICR apparatuses and are particularly inexpensive: to produce. On the other hand, installation of the preferably cylindrical inventive arrangement on the naturally cylindrical components of the magnet coil is particularly simple and saves space. In magnet coils in a helium tank of a cryostat, the operational temperature of the magnet coil and of the arrangement is in a region below 5 K. At such temperatures, superconductors having fibers of low-temperature superconductors may be used in the arrangement, which can be produced at particularly little cost.

A preferred further development of this embodiment of the magnet system comprises refrigerator cooling for the superconducting magnet coil and the arrangement serves to shield electromagnetic disturbances caused by the refrigerator cooling, wherein the arrangement preferably substantially surrounds a cold head of the refrigerator cooling. Conventional cooling fingers comprise magnetic substances with periodically varying magnetic properties or periodically moved magnetic parts and having frequencies in the range between 0.1 Hz and 10 Hz, which therefore generate magnetic field disturbances at these frequencies. These can be shielded in a particularly effective manner using the inventive arrangements. If the arrangement largely surrounds the cooling finger e.g. in the form of a cup, the shielding is particularly effective.

In another preferred further development, the magnet system comprises at least one arrangement which surrounds shielding coils of the superconducting magnet coil or which is integrated therein. In this case, the arrangement shields the magnetic field which is to be stabilized in the center of the magnet system from all magnetic sources of disturbance which are located radially outside of the arrangement. Moreover, the magnetic stray field in the space outside of the arrangement which is kept very low by the shielding coils is thereby also stabilized, i.e. is kept at very low values, in the event that the superconducting magnet coil which is located radially inside the arrangement is transferred to the normally conducting state via a quench.

Moreover, in another further development, the magnet system comprises at least one arrangement which is disposed radially inside a shielding coil of the superconducting magnet coil, e.g. on the inner tube of the helium tank or integrated in the winding of the magnet coil. In this manner, arrangements in the form of long closed circular cylinders with particularly large length to diameter ratios may be realized due to the small radius. These configurations come closer to the theoretically ideal shielding model of an infinitely long cylinder. In many cases, the actively shielded magnet coils have two axially separated short shielding coils instead of one axially long shielding coil, since arrangements in the form of long closed circular cylinders in the radial region of the shielding coils are more difficult to realize.

In one embodiment of this further development, the magnet system preferably comprises at least two arrangements, wherein the radially outer arrangement has a larger time constant for an induced current which flows in the peripheral direction of the cylinder than the radially inner arrangement. In this case, the radially inner arrangement in the form of a long closed cylinder can be accommodated in the radial region of the main field coil and the radially outer arrangement may be divided, e.g. corresponding to the geometry of the shielding coil, into two axially separated arrangements in the form of short closed cylinders and be accommodated in the radial region of the shielding coils. The radially inner arrangement shields the space it encloses, including the working volume in the center of the magnet coil, from temporally varying magnetic field disturbances from radially outer disturbance sources. If the second radially outer arrangement is not provided, the following problem would be caused in case of a quench of the magnet coil: the radially inner arrangement would be charged with current in the peripheral direction due to induction and, for a certain time, would itself represent a non-actively shielded magnet which has a strong stray field of large range. The entire system which consists of the actively shielded superconducting magnet coil and only one radially inner arrangement would have a considerable stray field for a certain time in case of a quench of the superconducting magnet coil, i.e. it would not necessarily have the good properties of an actively shielded magnet under all conditions. If a radially outer arrangement with a larger time constant for induced currents flowing in the peripheral direction is additionally used, the currents induced therein also shield the stray field generated by the radially inner arrangement towards the outside and keep the stray field of the overall arrangement at low values.

In another preferred embodiment of the inventive magnet system, the magnet system has a H- or C-shaped pole shoe magnet and the flat arrangement is substantially planar. In such magnets, the working volume with the magnetic field which has to be temporally stabilized is located between the substantially flat pole shoes of the magnet. The inventive arrangements in the form of flat surfaces are also suited for magnets of such shapes, to shield the working volume from magnetic disturbance sources located beyond the surfaces of the arrangement.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

Figure 1:
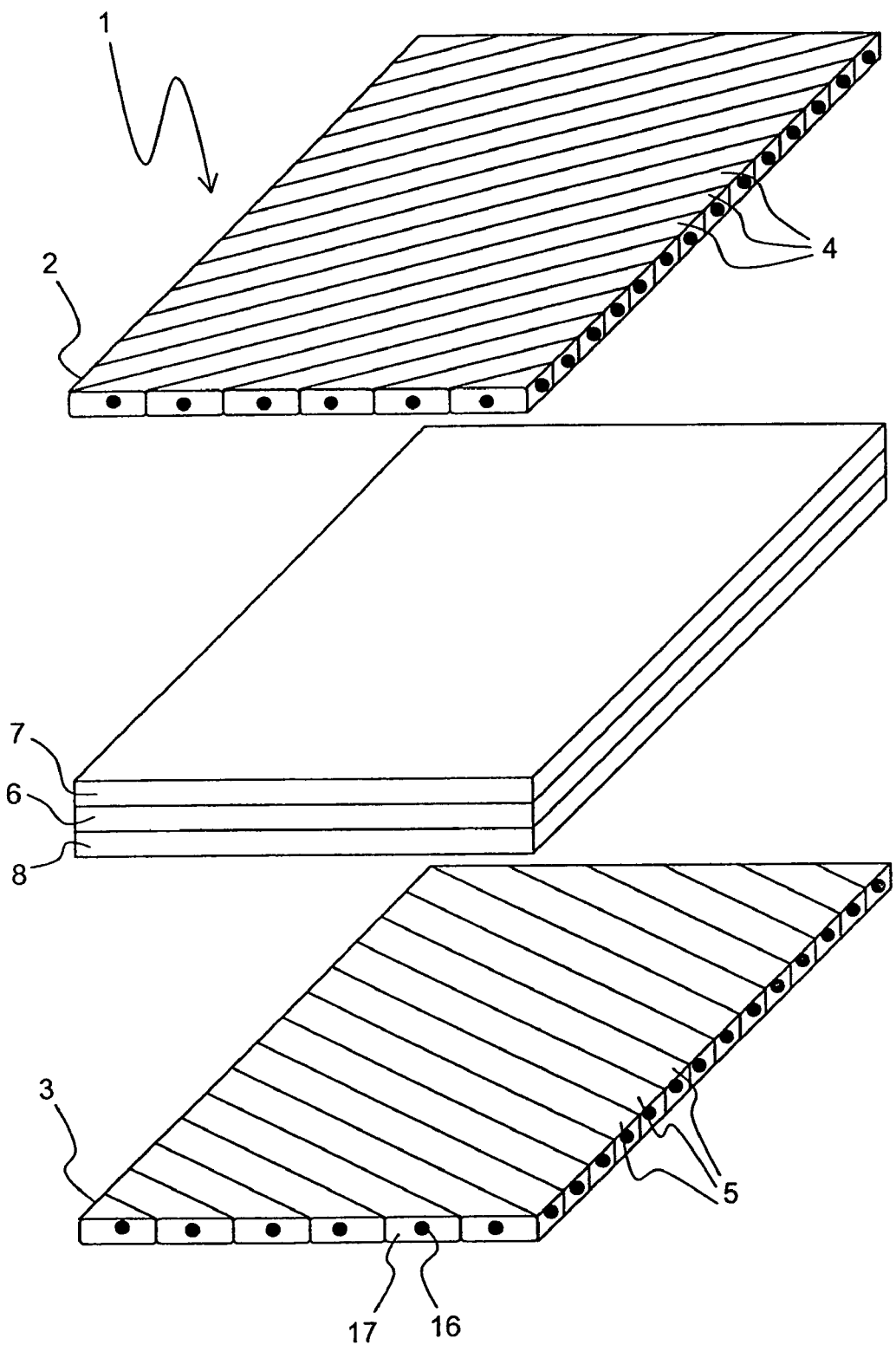
FIG. 1 schematically shows the various components of a first embodiment of an inventive arrangement.

The invention concerns electrically conducting flat arrangements with particularly low resistivity which may be used e.g. for shielding temporally varying magnetic stray fields in a working volume.

The present invention proposes flat arrangements which guide electric currents within these surfaces with a particularly low electrical resistance.

The invention provides shielding of spatial regions, in particular e.g. of the working volume of magnetic resonance apparatuses, from temporally varying magnetic fields above a lower limit frequency. The invention also provides shielding of the working volume of magnetic resonance apparatus with superconducting main field coil with cooling using a cyclically operating refrigerator comprising a cold head which generates temporally varying magnetic fields.

Further possible applications of the invention include the improvement of the behavior of superconducting magnet coils in a transition from the superconducting state of the magnet coils into the normally conducting state (quench). For actively shielded magnet coils with spatially confined magnetic stray fields, the limitation of the spatial extent of the magnetic stray field in case of a quench of the magnet coil is particularly important.

The preferred application of the inventive arrangements is the shielding of temporally varying magnetic fields. Shielding may also be obtained through use of normally conducting sheet metals of the same shape or sheet metals of superconducting material. In contrast to use of normally conducting sheet metal, the inventive arrangements are advantageous in that, due to a considerably smaller electrical resistance, disturbances of considerably smaller frequency, e.g. in the region between 1 mHz and 1 Hz can still be effectively shielded. When sheet metals of superconducting materials is used, even static magnetic fields may theoretically be shielded. Flat superconductors have, however, the decisive disadvantage that the electric currents which they carry are unstable i.e. the current distributions change completely in response to minimum fluctuations in the operating temperature or in the strength of a superposed static magnetic field. In consequence thereof, these sheet metals themselves are a source of magnetic field disturbances.

Embodiments of the inventive arrangements may be extracted from the figures. With regard to reference numerals with a slash, the number behind the slash refers to the number of the figure in which the reference numeral is once more used.

FIG. 1 shows the design of an embodiment of an inventive arrangement 1. A first layer 2 contains adjacent first superconducting wires 4. A second layer 3 also contains neighboring second superconducting wires 5 which are disposed at an angle of approximately 90° with respect to the first superconducting wires 4 of the first layer 2. A flat support body 6 of normally conducting metal is disposed between the two layers 2 and 3 and is coated on both sides with layers 7 and 8 of solder which is normally conducting under the operating conditions. Each superconducting wire 4, 5 contains at least one fiber 16 of superconducting material which is generally embedded in a normally conducting substrate 17.

Figure 2:
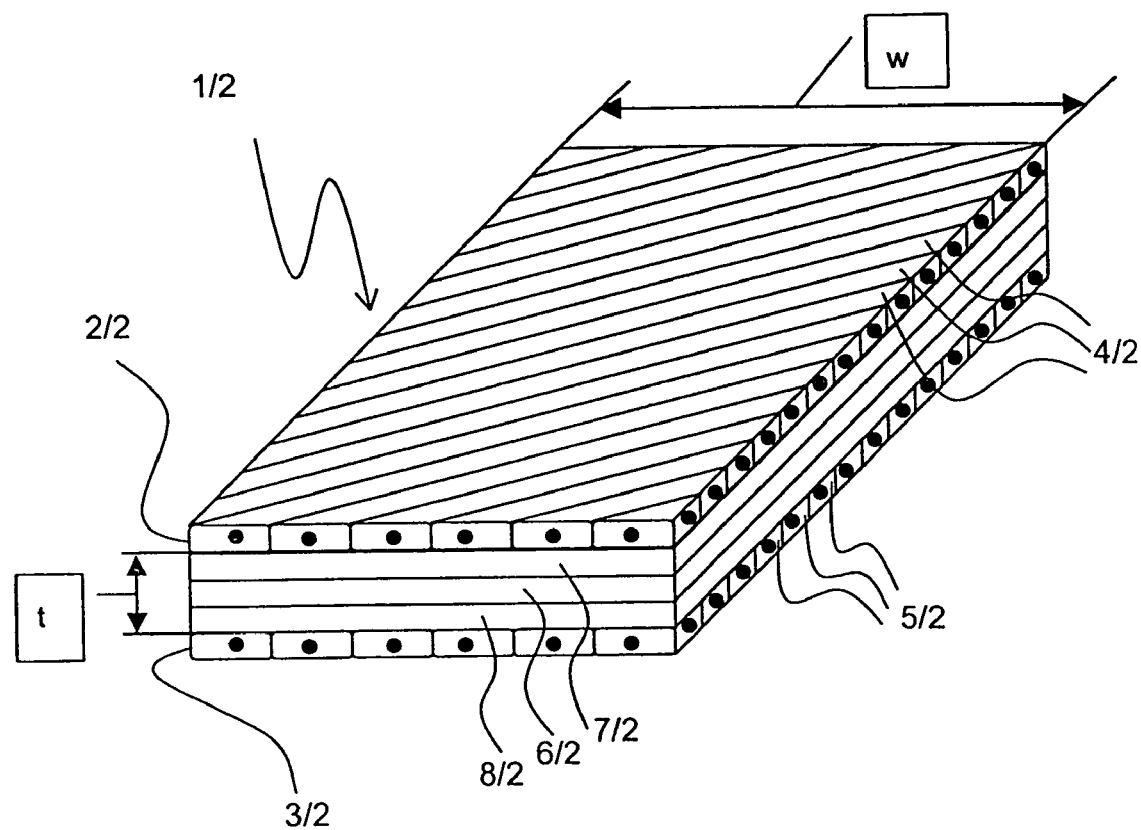
FIG. 2 schematically shows a perspective view of the same embodiment of FIG. 1 in the assembled state.

FIG. 2 shows the same embodiment of the inventive arrangement. The two layers 2/2 and 3/2 are thereby electrically conductingly and mechanically rigidly connected to each other through the solder layers 7/2 and 8/2 and the metallic support body 6/2 and form an electrically conducting mechanically stable and flexible flat arrangement 1/2. Since the superconducting wires 4/2 and 5/2 short-circuit large regions of the flat arrangement 1/2, an extremely small ohmic resistance is obtained during current transport within the flat arrangement 1/2. The width of the arrangement 1/2 is designated with w, the thickness of the support body 6/2 with the two solder layers 7/2 and 8/2 is designated with t. The superconducting wires 4/2, 5/2 preferably have a flat cross-section of small extension perpendicular to the flat arrangement 1/2.

Figure 7:
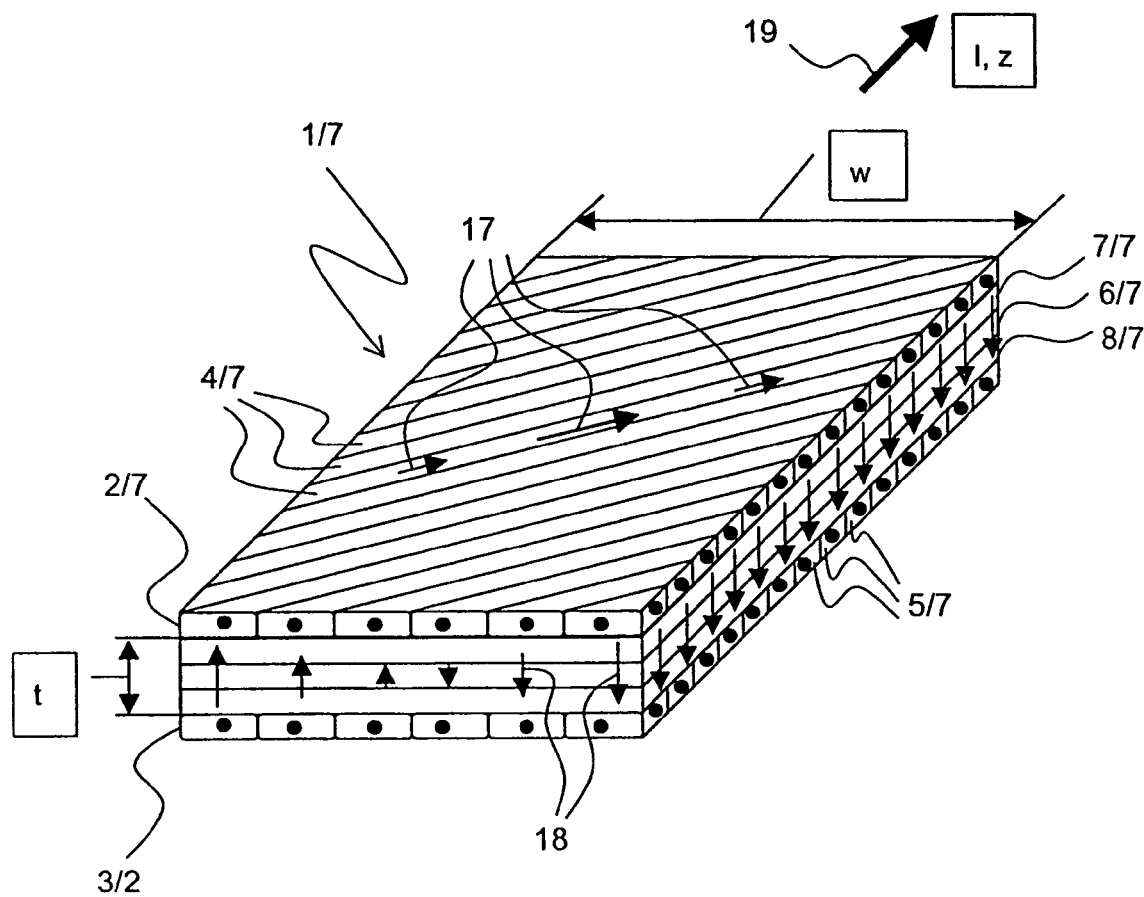
FIG. 7 shows a perspective representation of the arrangement of FIG. 6 to show the transverse current dependence during current transport in the z-direction.

FIG. 7 also shows the same embodiment of the inventive arrangement 1/7. The arrow 19 symbolizes transport of an electric current I in the z-direction. The superconducting wires 4/7 and 5/7 are thereby both directed at an angle of 45° with respect to the direction of the electric current I. As is shown in a more accurate analysis, a resistance-free electric current is obtained in all superconducting wires 4/7 and 5/7 which extends parallel to the direction of the superconducting wires and which has a component in the direction of the electric current I. This is symbolized through arrows 17. The current in the superconducting wires 4/7, 5/7 is maximum in the center of the wires and decreases parabolically to a value of 0 towards the lateral limits of the arrangement 1/7. This decrease in the current on both sides of the center of the wires is symbolized through the different length of the arrows 17. With this current distribution in the superconducting wires 4/7, 5/7, transverse compensating currents form in the normally conducting support bodies 6/7 and the solder layers 7/7 and 8/7 (symbolized by arrows 18). These vanish exactly in the center of the arrangement 1/7 and linearly increase towards the side edges, as is symbolized by the length and the direction of the arrows 18. Although these compensating currents are resistive, the ohmic resistance is small, since they extend over an extremely short distance t on the order of magnitude of 0.1 mm and are distributed over a large cross-sectional area.

Figure 3:
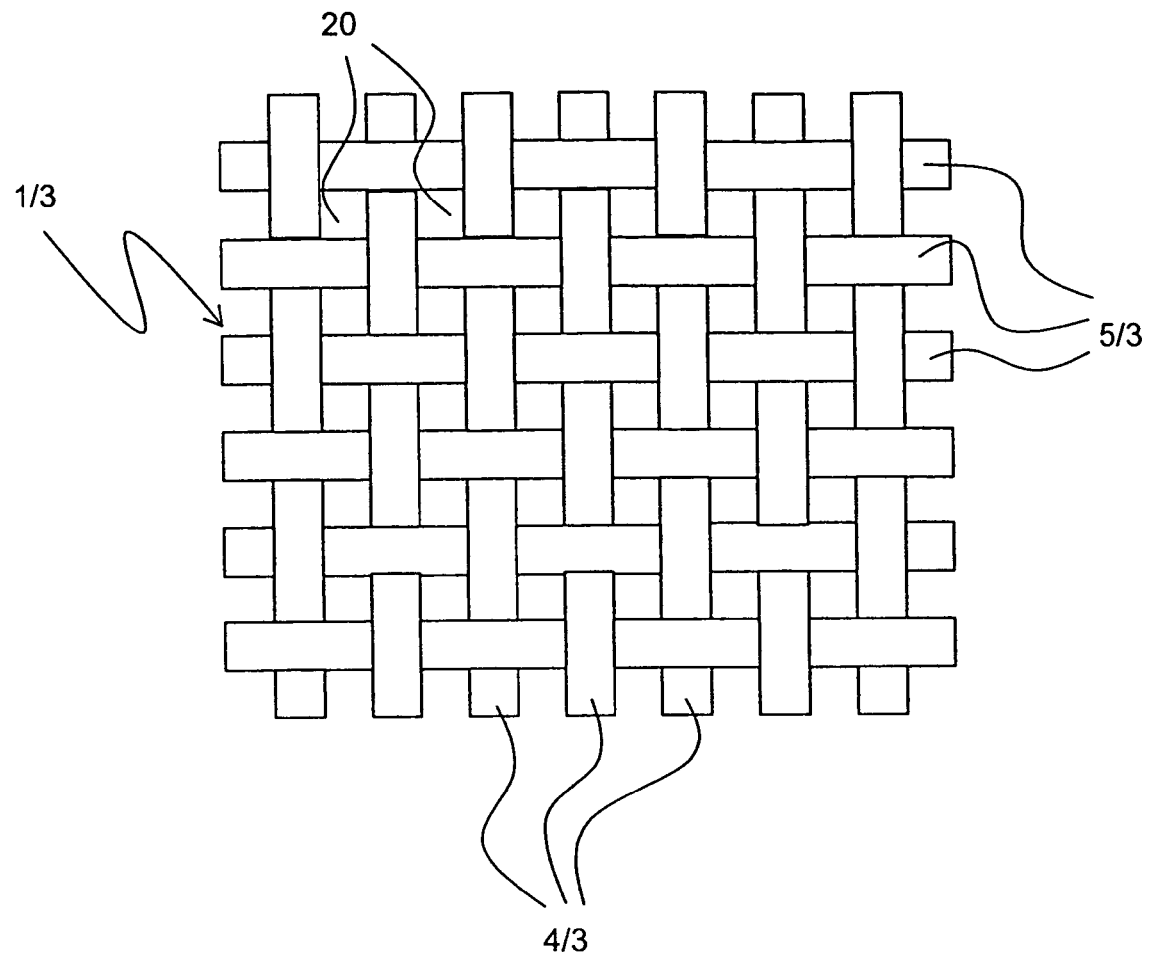
FIG. 3 schematically shows the projection of a second embodiment of an inventive arrangement.

FIG. 3 shows a view onto a second embodiment of an inventive arrangement 1/3. The superconducting wires 4/3 and 5/3 form a fabric. In a practical embodiment, the gaps 20 which are generated thereby should be as small as possible.

Figure 4:
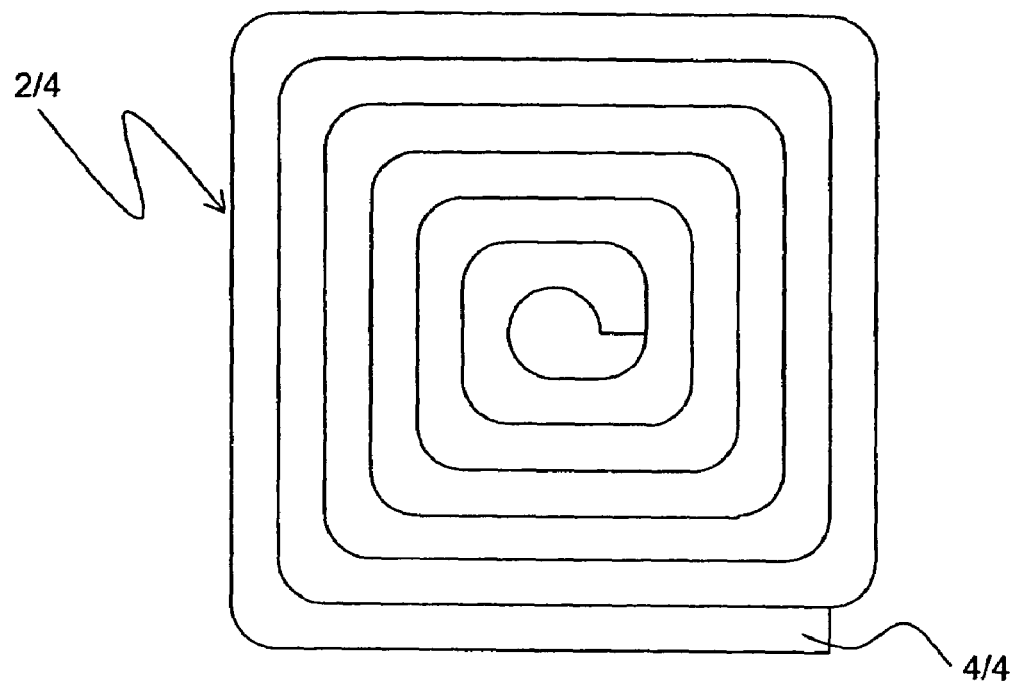
FIG. 4 schematically shows the two layers of a third embodiment of an inventive arrangement.
Figure 4:
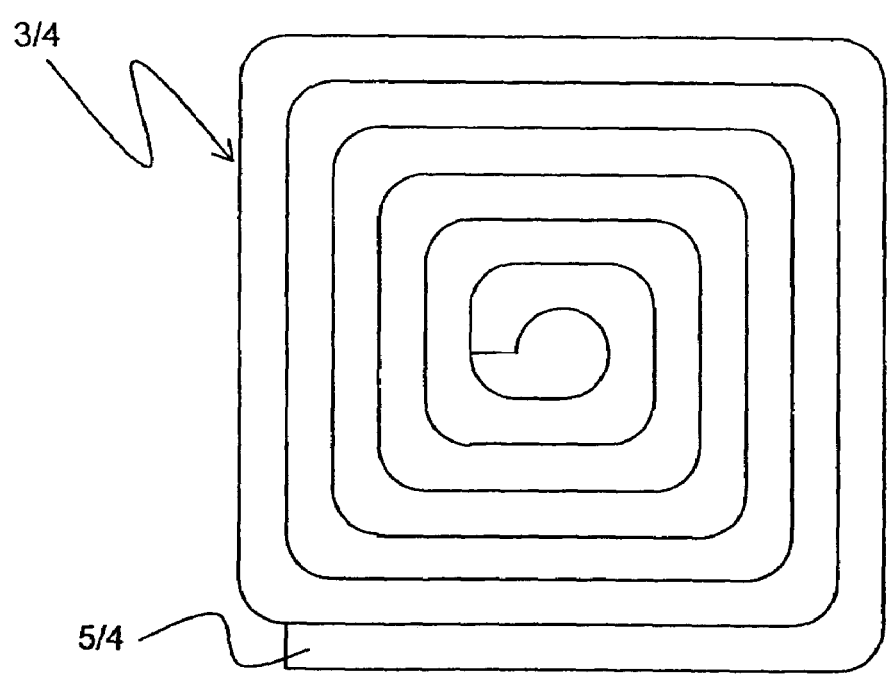

FIG. 4 shows a top view of an alternative design of layers 2/4 and 3/4 in the form of spirally disposed superconducting wires 4/4 and 5/4 which can be joined to form another embodiment of an inventive arrangement.

Figure 9:
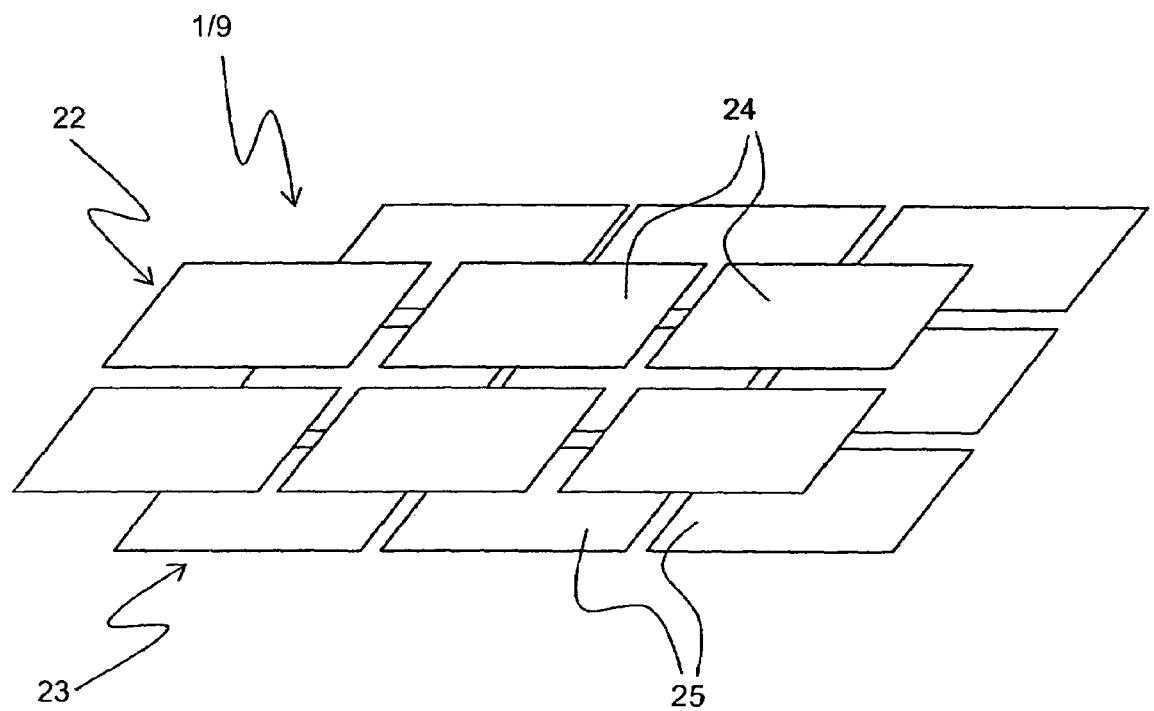
FIG. 9 shows an inventive arrangement which consists of partial layers.

The inventive arrangement 1/9 shown in FIG. 9 consists of two layers 22 and 23. Each layer 22, 23 contains neighboring partial sections 24 and 25. The partial sections 24 of the layer 22 are connected to the partial sections 25 of the layer 23 in a normally conducting manner and over a wide area. Current transport within the flat arrangement 1/9 is also associated with very small ohmic resistances due to the large area current transition over small distances between the partial sections 24, 25 of the various layers 22, 23. The partial sections 24, 25 may be inventive arrangements which themselves consist of several portions, e.g. arrangements 1/2 or 1/3 of FIGS. 2 and 3. Alternatively, the partial sections 24 of the layer 22 may consist only of layers 2/2 of FIG. 1 and the partial sections 25 of the layer 23 may consist only of layers 3/2 of FIG. 2. The electrical resistance during current transport in the arrangement 1/9 may be precisely controlled through selection of the size and number of partial sections 24, 25. Small partial sections of a correspondingly large number produce a relatively large electrical resistance and vice versa.

Figure 5:
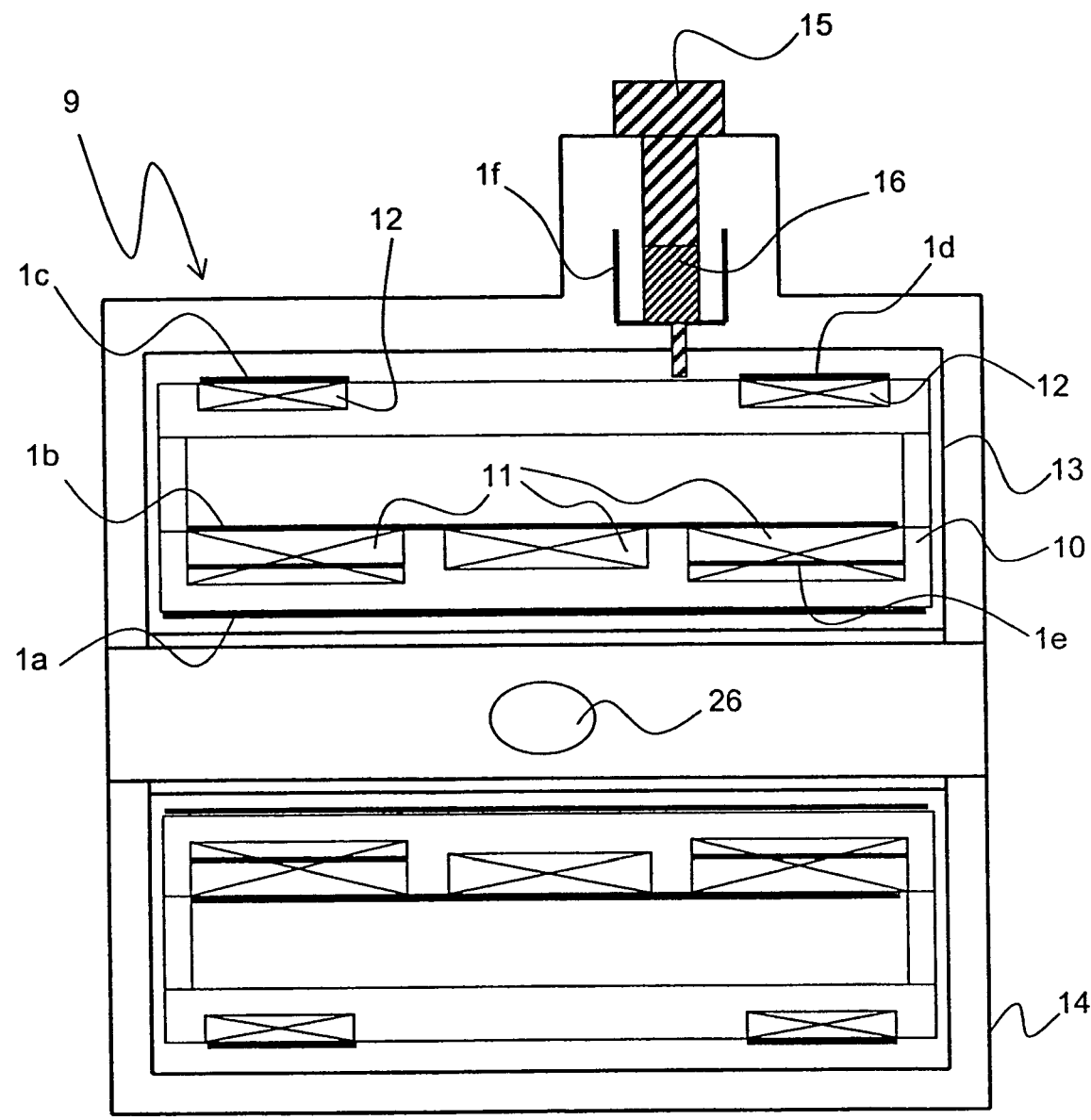
FIG. 5 schematically shows the cross-section of a cryostat of an MRI apparatus with a superconducting main field coil disposed in a helium tank and various geometrical configurations of the inventive arrangements.

FIG. 5 shows a cross-section through a magnet system 9 of an MRI apparatus with superconducting main field coil 10. It is located in a helium tank 13 which is partially filled with liquid helium, and generates a magnetic field in a working volume 26 with extremely high requirements with regard to spatial and temporal consistency. The helium tank 13 is mounted in a vacuum tank 14 via fittings (not shown). The consumption of liquid helium is reduced or completely eliminated through use of a refrigerator comprising a hold head 15. A lower region of the cold head 15 contains regenerator material 16 having ferro-, ferr- or anti-ferromagnetic properties which change periodically with time during operation with a basic frequency of between approximately 0.1 Hz and 10 Hz. The regenerator material 16 thereby changes its magnetization in periodic intervals within the background field of the main field coil 10 and thereby represents a temporally periodic magnetic disturbance source for the magnetic field in the working volume 26. The main field coil 10 is actively shielded and has main field windings 11 and shielding windings 12 through which opposite current flows, to considerably reduce the magnetic field of the main field windings 11 in the region outside of the magnet system 9.

To shield the magnetic field disturbance caused by the regenerator material 16 in the working volume 26, it is important that the inventive arrangements 1a, 1b have a shape which segregates the disturbance source 16 and the working volume 26 to be protected into two different semi-spaces which are separated by the arrangement. The arrangement 1a and also the alternatively possible arrangement 1b in the form of long closed cylinders meet this requirement. The arrangement 1f in the form of a pot surrounding the regenerator material 16 is also well suited, since, in this case as well, the disturbance source 16 and the working volume 26 are in different semi-spaces separated by the arrangement.

The arrangements 1c and 1d surround the shielding windings 12 of the main field coil 10. They have the task of keeping the stray field of the radially inner main field coil 10 at small values in case of transition of the windings 11 and 12 from the superconducting into the normally conducting state. This is effected through shielding currents which are generated in the arrangements 1c and 1d by inductive coupling.

One combination of the arrangements 1a or 1b with the arrangements 1c and 1d is particularly preferred, with which the arrangements 1a or 1b protect the working volume from field disturbances from radially outer disturbance sources and the arrangements 1c and 1d stabilize the magnetic stray field at small values even when the arrangements 1a or 1b are inductively charged during transition of the windings 11 and 12 from the superconducting into the normally conducting state and thereby tend to enlarge the stray field.

The arrangements 1e integrated in the main field windings 11 do not principally serve to shield magnetic fields. These arrangements 1c are designed e.g. through selection of the superconducting wires, such that the superconducting wires are transferred from the superconducting state into the normally conducting state at a predetermined critical current. When parts of the windings 11 or 12 are transferred into the normally conducting state, the arrangements 1e are inductively charged with current. When the critical current is exceeded, the arrangements 1e heat relatively quickly thereby triggering transfer into the normally conducting state in the bordering regions of the winding 11. In this manner, the normally conducting region in the main field coil 10 expands rapidly. This is advantageous, since the heat produced during this process is distributed over a larger region, thereby preventing overheating of confined normally conducting zones.

Figure 6:
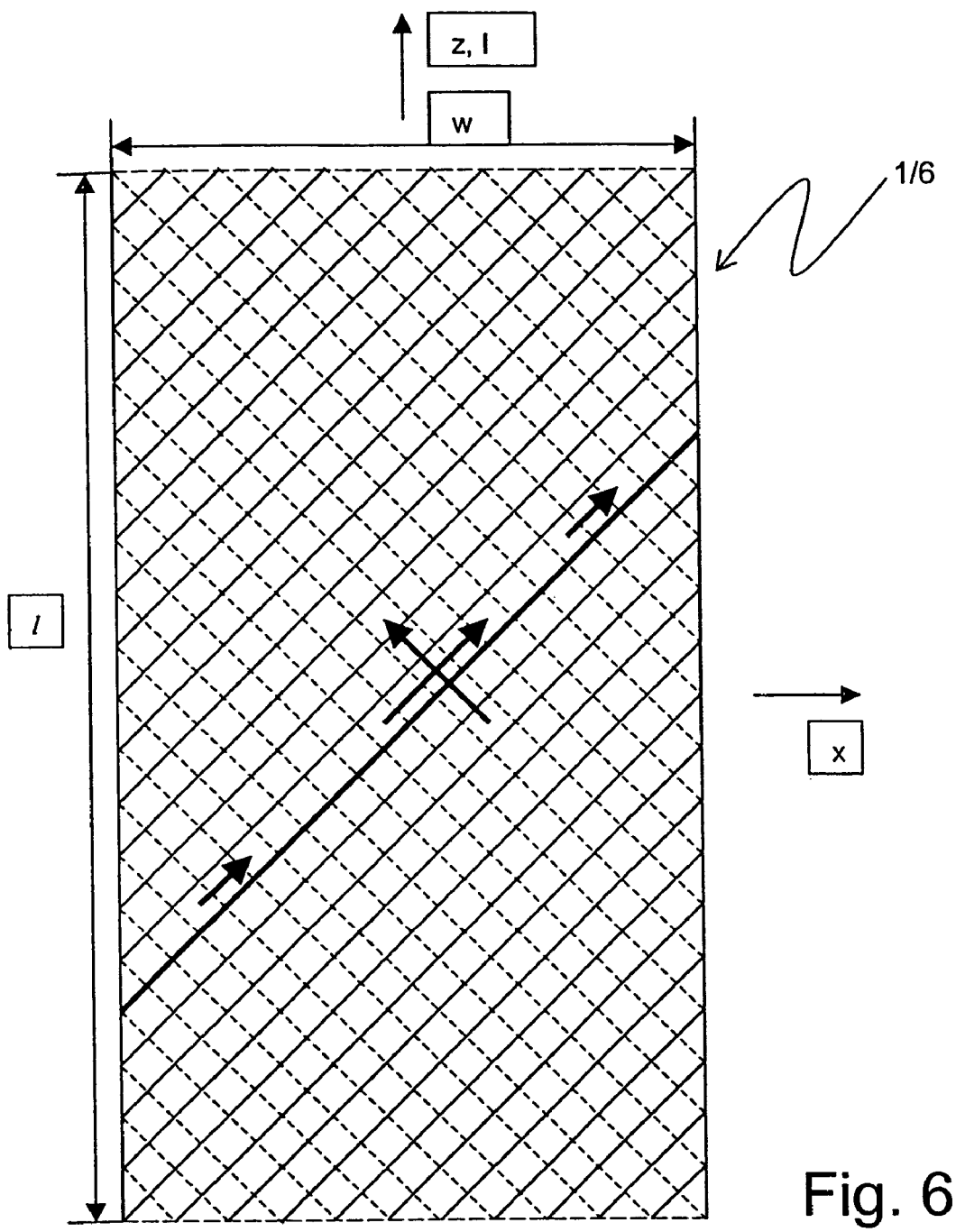
FIG. 6 shows a projection of an arrangement of FIG. 2 with a width serving as a model for calculating the current distributions and the electrical resistance during current transport in the z-direction (above) and the dependence of the electric current in a superconducting wire (bottom)
Figure 6:
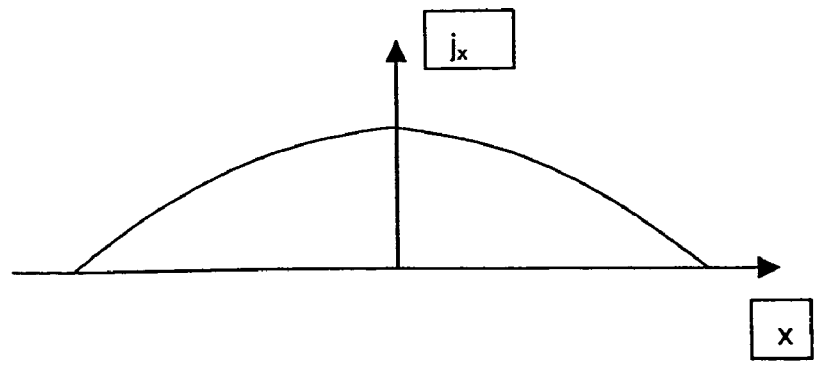

Spatial current distribution and ohmic resistance during current transport in inventive arrangements FIGS. 6 and 7 illustrate calculation of the current distribution and of the electrical resistance during current transport through the arrangement 1/6 and 1/7. The arrangement 1/6, 1/7 has a width w in the x-direction and a length l in z-direction. The thickness of the resistive layer (6/7, 7/7, 8/7, FIG. 7) between the layers 2/6 and 3/5 or 2/7 and 3/7 is t. The average specific resistance of the resistive layer is $\rho_r$. In case of current transport parallel to the direction of the superconducting wires in the layers 2/6 and 3/6 or (FIG. 6) i.e. parallel to the straight lines z=+/−x, the electrical resistance completely vanishes. The resistance is maximized for current transport in the z-direction but nevertheless remains very small compared to the current transport in normally conducting sheet metals (shown below).

Essential features of the physical/mathematic model for calculating the current distribution and resistance:

end effects at z=+/−l/2 are not taken into consideration. The end effects are practically eliminated if the z-axis extends in a curved manner about a cylinder surface and the "ends" of the arrangement at z=+/−l/2 are joined without a seam. Such an arrangement corresponds e.g. to the arrangements 1a and 1b in FIG. 5. A current may be inductively generated in the peripheral direction.

the two layers 2/6 and 3/6 are treated as layers of vanishing thickness. Current transport within a layer is permitted only parallel to the direction of the superconducting wires of the layer. Actual current components perpendicular to the direction of the superconducting wires represent a parallel mechanism for the current transport which is practically short-circuited by the mechanism shown herein and which slightly reduces the overall resistance.

the current distributions within one layer are described as line current densities with the components $j_z(z, x)$ and $j_x(z, x)$. There is no variation in the z-direction. If a current I is transported in the +z-direction, the following applies for layer 2/6:

$$j_z(x)=j_x(x)$$

and in layer 3/6:

$$j_z(x)=-j_x(x)$$

each layer 2/6 and 3/6 transports half of the overall current I in the z-direction. Therefore:

$\int j_z(x)dx = I/2$. The integral extends from $-w/2$ to $+w/2$.

the superconducting wires end at the lateral edges at $x=+/-w/2$ and current transport in the x-direction is not possible at these locations. The following applies:

$j_z(x=+/-w/2)=0$.

the current distribution in the resistive intermediate layer (6/7, 7/7, 8/7, FIG. 7) is described by a transverse-surface current density $j_t(x)$. There is no variation in the z-direction.

the transverse current density $j_t(x)$ in the resistive intermediate layer and the current density in the layers 2/6 and 3/6 must obey the continuity equation. The following applies:

$dj_x(x)/dx = -j_t(x)$.

each superconducting wire has a constant electric potential V due to its infinitely large electric conductance. Superconducting wires of the two layers 2/6 and 3/6 whose point of intersection is at $x=0$ have the same electric potential due to symmetry. For current transport in the $+z$ direction, the potentials V2 or V3 in the superconducting wires in both layers correspondingly decrease linearly with increasing z-position, more precisely with the respective coordinate b of the point of intersection of the superconducting wire with the z-axis. The superconducting wires of the layer 2/6 extend along the following straight line $z=b+x$ A suitable approach for the electric potential of an arbitrary point of the layer 2/6 is thereby:

$V2(z,x)=a(z-x)$, wherein a is a constant which is to be determined and which describes the potential gradient. The following applies along a superconducting wire of layer 2/6:

$V2(z=b+x,x)=ab$.

In correspondence thereto, the following applies for the electric potential of any point of the layer 3/6:

$V3(z,x)=a(z+x)$.

Calculation of current distribution and resistance at an arbitrary location of the arrangement 1/6 with the coordinates $(z,x)$, the potential difference between the layers 2/6 and 3/6 which generates the current density $j_t(z,x)$ corresponding to the ohmic law, is:

$V23(z,x)=V2(z,x)-V3(z,x)=-2ax$.

In correspondence with ohm's law, the following applies for the current density $j_t(z,x)$:

$j_t(z,x)=V23(z,x)/\rho_t/t=-2ax/\rho_t/t$.

The transverse current density $j_t(z,x)$ is therefore proportional to x as indicated by arrows 18 in FIG. 7.

in accordance with the continuity equation, the current density $j_x(z,x)$ in the layer 2/6 is parabolic if the transverse current density $j_t(z,x)$ is linear. The following applies taking into consideration the boundary condition at $x=+/-w/2$:

$j_x(z,x)=-a(w^2/4-x^2)/\rho_t/t=j_z(z,x)$

This is the parabolic behaviour shown at the bottom of FIG. 6.

a must be determined from the condition that the integrated current density is equal to half the transport current. The following applies:

$\int j_z(z,x)dx=I/2$ and therefore:

$a=-3I\rho_t t/w^3$.

Results:

The dependence of the electric potential can be quantitatively extracted using the determination of the constant a:

$V2(z,x)=-3I\rho_t t(z-x)/w^3$.

The following applies for the potential gradient U in the z-direction along an arrangement of length l:

$U=V2(z=l/2,x)-V2(z=+l/2,x)=3I\rho_t tl/w^3$.

For the electrical resistance $Rx=U/I$ of such an arrangement the following applies:

$Rx=3\rho_t tl/w^3=6\pi\rho_t tr/w^3$.

The right-hand side thereby applies for a cylindrical arrangement of length $l=2\pi r$ as in the arrangement 2/5 of FIG. 5.

Cylindrical arrangements may be approximately associated with inductances L for currents flowing in the peripheral direction, i.e.:

$L=\mu_0 r^2\pi/w$.

This produces a time constant $\tau x=L/Rx$ which characterizes the decay of eddy currents flowing in the peripheral direction:

$\tau x=(\mu_0 rw^2)/(6\rho_t t)$

Example:
w=1 m
t=0.001 m
r=0.2 m
$\rho_t=3.4\times10^{-7}$ Ωm (relatively high specific resistance of solder)

which leads to: $\tau x=123.5$ s$\approx$2 min.

For comparison: the time constant $\tau m=L/R$ for eddy currents flowing in the peripheral direction of a normally conducting metal cylinder are:

$\tau m=(\mu_0 rt_m)/(2\rho)$.

$t_m$: sheet metal thickness of the metal cylinder.

A cylinder of pure copper sheet metal instead of the arrangement 1/5 in FIG. 5 has a considerably smaller specific resistance $\rho=1.7\times10^{-10}$ Ωm at an operating temperature of 4.2 K compared to the solder of arrangements 1/6 and 1/7, wherein one obtains with w=1 m, r=0.2 m, $t_m$=0.001 m a time constant of:

$\tau m=0.74s$.

The comparison of the time constant of 2 min or 0.74 sec shows the potential of the inventive arrangements to shield disturbances with low frequencies. It must be observed that the current transport was examined in a particularly unfavorable direction. If required, the electrical resistance of such arrangements may be further reduced either through reducing the thickness t or through use of the arrangements 1/3 in FIG. 3 which require no solder with a relatively large specific resistance, but which provide a direct metallic contact between the superconductors 4/3 and 5/3.

Figure 8:
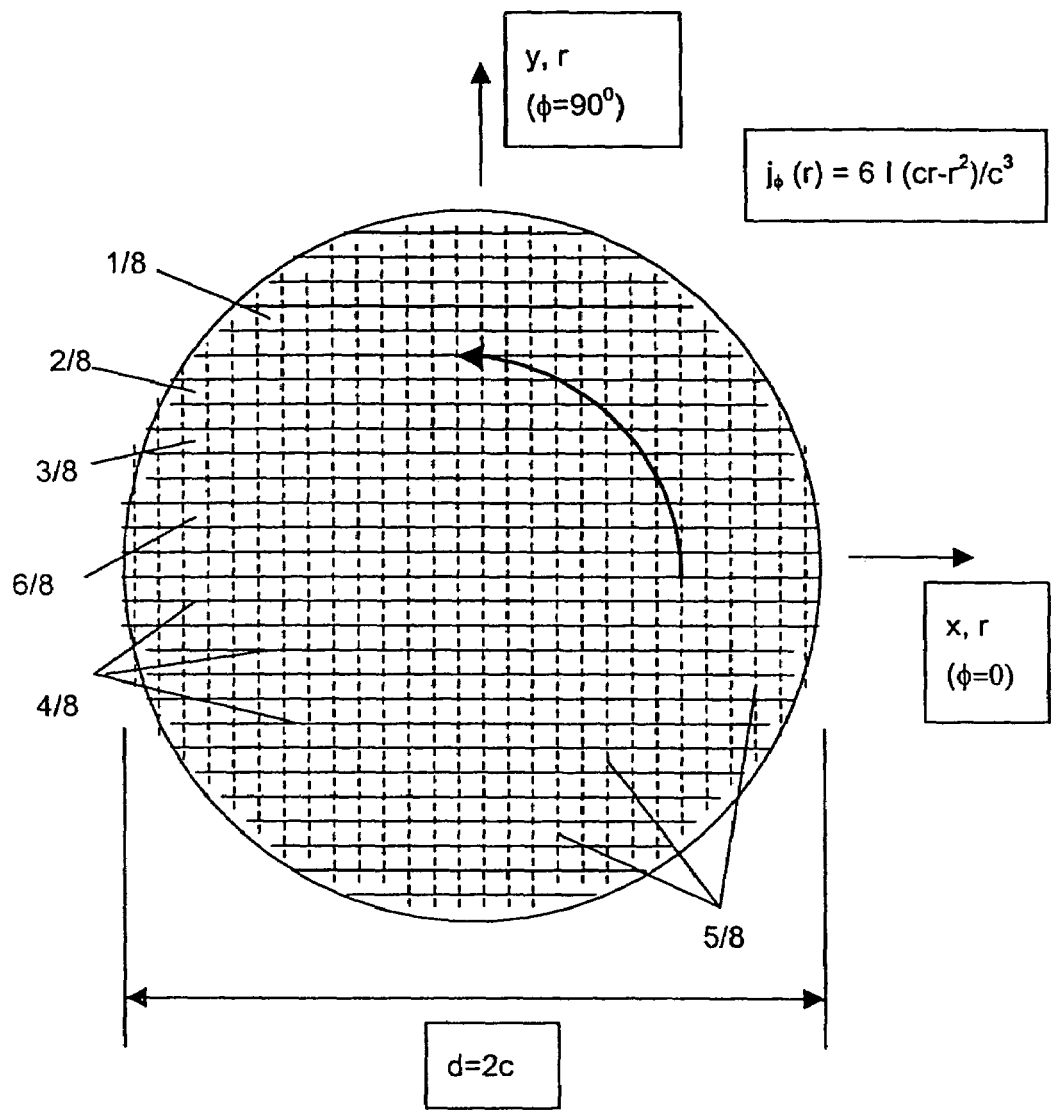
FIG. 8 shows a projection of a circular section of the arrangement according to FIG. 2 with an eddy current around a center.

FIG. 8 shows a circular section of an arrangement 1/8 with radius c which is also designed like the arrangement 1/2 of FIG. 2 with superconducting wires 4/8 in a first layer 2/8 which extend in a x-direction and with superconducting wires 5/8 in a second layer 3/8 which extend in a y-direction. An eddy current I is e.g. impressed through induction in the peripheral direction φ about a center. The line current density $j_\phi(r)$ which is averaged through the entire thickness of the arrangement 1/8 has the following special form in this calculation example:

$$j_\phi(r)=6I(cr-r^2)/c^3.$$

The integration over the radius r shows that precisely the current I is transported in the peripheral direction. The current density vanishes at r=0, passes parabolically a maximum at r=c/2 and vanishes again at r=c.

Factoring the current density $j_\phi(r)$ into its x and y components produces:

$$j_x(r,\phi)=-6I(cr-r^2)/c^3 \sin(\phi)$$

$$j_y(r,\phi)=6I(cr-r^2)/c^3 \cos(\phi)$$

$J_x(r,\phi)$ thereby flows without resistance in the layer 2/8 with the superconducting wires extending in the x-direction and, corresponding to $j_y(r,\phi)$ in the layer 3/8. The continuity equation produces the surface current density $j_r(r,\phi)$ in the intermediate layer 6/8 which, due to the specific resistance $\rho_r$, causes an electrical resistance Rx which characterizes this eddy current. The following applies:

$$j_r(r,\phi)=d/dy(j_x(x,y))$$

and after simple trigonometric transformations:

$$j_r(r,\phi)=3Ir \sin(2\phi)/c^3.$$

The electrical resistance Rx is obtained from the electric power Px associated with $j_r(r,\phi)$:

$$Px=RxI^2=\rho_r t \int d\phi \int r dr j_r^2(r,\phi).$$

The resistance Rx is therefore:

$$Rx=(9/4)\rho_r t\pi/c^2.$$

If the arrangement 1/8 is replaced by a normally conducting metallic disk with the same linear current density $j_\phi(r)=6 I(cr-r^2)/c^3$, one obtains for the resistance Rm associated therewith:

$$Rm=(6/5)\pi\rho/t_m.$$

Example:
t=0.0001 m (solder layer with a thickness of 0.1 mm)
$t_m$=0.001 m
r=0.2 m
$\rho_r$=3.4×10$^{-7}$ Ωm (solder)
$\rho$=1.7×10$^{-10}$ Ωm (pure copper at low temperatures, 4.2 K)
This gives:

Rm=107 Rx.

The particularly large electric conductance of the inventive arrangements compared to metallic sheet metals can once more be observed. The conductivity may be further increased through use of arrangements without solder, e.g. arrangements 1/3 in FIG. 3.

I claim:

1. A magnet system having a thin multi-layer structure with wire which is superconducting under operating conditions and having normally conducting material which is not superconducting under operating conditions, the structure comprising:

a first layer of first wires which are superconducting during operation of the structure, said first wires disposed to extend without crossing each other;

a second layer of second wires which are superconducting during operation of the structure, said second wires disposed to extend without crossing each other but to cross said first wires in said first layer; and normally conducting material which is not superconducting during operation of the structure, said normally conducting material cooperating with said first and said second wires to effect resistive electrical contact between said first and said second layers, wherein the structure contains no closed superconducting loops.

2. The magnet system of claim 1, wherein said first wires of said first layer are designed as warp threads and said second wires of said second layer are designed as weft threads interwoven with said warp threads of said first layer.

3. The magnet system of claim 1, wherein said first layer extends at a substantially constant separation from said second layer.

4. The magnet system of claim 3, wherein said first and said second layers have curved surfaces.

5. The magnet system of claim 1, wherein said first wires of said first layer are disposed parallel to each other and said second wires of said second layer are disposed parallel to each other but extending in a different direction than said first wires of said first layer, wherein said fir-st and said second layers are soldered together with a solder which is normally conducting.

6. The magnet system of claim 1, wherein said first wires and/or said second wires are soldered onto a flat support body, which is normally conducting during operation and using solder which is normally conducting during operation.

7. The magnet system of claim 1, wherein said first wires and said second wires cross each other at angles of at least 30°.

8. The magnet system of claim 7, wherein said first and said second wires cross at an angle of substantially 90°.

9. The magnet system of claim 3, wherein said first and said second wires are each directly soldered onto a flat support body using a solder which is normally conducting during operation.

10. The magnet system of claim 1, wherein said first and said second wires have a flat cross-section with large width parallel to a flat extension and small height perpendicular to said flat extension.

11. The magnet system of claim 1, wherein said first and/or said second wires consist essentially of a low-temperature superconductor which is superconducting only at temperatures below a critical temperature of less than 30° K.

12. The magnet system of claim 1, wherein said first and/or said second wires consist essentially of a high-temperature superconductor which is superconducting at temperatures below a critical temperature of more than 30° K.

13. The magnet system of claim 1, wherein said first layer contains first partial sections disposed next to each other in a first smooth surface and said second layer contains second partial sections disposed next to each other in a second smooth surface, wherein said first and said second partial sections are not directly connected to each other or are only connected resistively to another and borders between said first partial sections are shifted in a parallel manner with respect to said second partial sections.

14. The magnet system of claim 1, wherein said thin multi-layer structure defines a closed cylinder surface.

15. The magnet system of claim 14, wherein said closed cylinder surface is a circular cylinder surface.

16. The magnet system of claim 14, wherein a time constant of an induced current which flows in a peripheral direction of said cylinder surface is adjusted to a predetermined value through selection and arrangement of said first wires, said second wires, and said normally conducting material.

17. The magnet system of claim 16, where said time constant is between 1 second and 5 minutes.

18. The magnet system of claim 1, wherein said first and said second wires are transferred from a superconducting into a normally conducting state at a precisely predetermined value of a current load under operating conditions through selection of superconducting properties thereof.

19. The magnet system of claim 1, wherein the magnet system is structured and dimensioned for an NMR, MRI or ICR apparatus.

20. The magnet system of claim 1, wherein the system comprises a superconducting magnet coil and the thin multi-layer structure is disposed on a cylindrical body.

21. The magnet structure of claim 20, wherein said magnet coil is disposed in a helium tank of a cryostat and is actively shielded, the thin multi-layer structure being disposed on a wall of the helium tank or on outermost windings of said superconducting magnet coil.

22. The magnet system of claim 20, wherein the system comprises a refrigerator cooling for said superconducting magnet coil and the thin multi-layer structure shields electromagnetic disturbances caused by said refrigerator cooling.

23. The magnet system of claim 22, wherein the thin multi-layer structure substantially surrounds a cold head of said refrigerator cooling.

24. The magnet system of claim 20, wherein the thin multi-layer structure surrounds shielding coils of said superconducting magnet coil or is integrated therein.

25. The magnet system of claim 20, wherein the thin multi-layer structure is disposed radially inside a shielding coil of said superconducting magnet coil.

26. The magnet system of claim 25, wherein a radially outer thin multi-layer structure has a first time constant for an induced current which flows in a peripheral direction which is larger than a second time constant of a radially inner thin multi-layer structure.

* * * * *